(12) United States Patent
Beasom

(10) Patent No.: US 6,835,628 B2
(45) Date of Patent: Dec. 28, 2004

(54) INTEGRATED CIRCUIT WITH A MOS CAPACITOR

(75) Inventor: James D. Beasom, Melbourne Village, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 09/992,880

(22) Filed: Nov. 5, 2001

(65) Prior Publication Data

US 2003/0087496 A1 May 8, 2003

(51) Int. Cl.[7] .............................................. H01L 21/331
(52) U.S. Cl. ...................... 438/309; 438/325; 438/329
(58) Field of Search ................. 438/202, 234, 438/238, 239, 309, 325, 329, 353, 370, 371, 372

(56) References Cited

U.S. PATENT DOCUMENTS

| | | | | |
|---|---|---|---|---|
| 4,296,429 A | * | 10/1981 | Schroeder | .................. 257/330 |
| 5,411,911 A | * | 5/1995 | Ikeda et al. | .................. 438/426 |
| 5,525,529 A | * | 6/1996 | Guldi | .......................... 438/565 |
| 5,792,681 A | * | 8/1998 | Chang et al. | ................ 438/210 |
| 6,228,736 B1 | * | 5/2001 | Lee et al. | .................... 438/396 |
| 6,258,678 B1 | * | 7/2001 | Liaw | ........................... 438/303 |
| 6,468,858 B1 | * | 10/2002 | Lou | ............................ 438/253 |

* cited by examiner

Primary Examiner—Hoai Pham
(74) Attorney, Agent, or Firm—Fogg and Associates, LLC; Scott V. Lundberg

(57) ABSTRACT

The present invention relates to an integrated circuit having a MOS capacitor. In one embodiment, a method of forming an integrated circuit comprises forming an oxide layer on a surface of a substrate, the substrate having a plurality of isolation islands. Each isolation island is used in forming a semiconductor device. Patterning the oxide layer to expose predetermined areas of the surface of the substrate. Depositing a nitride layer overlaying the oxide layer and the exposed surface areas of the substrate. Implanting ions through the nitride layer, wherein the nitride layer is an implant screen for the implanted ions. Using the nitride layer as a capacitor dielectric in forming a capacitor. In addition, performing a dry etch to form contact openings that extend through the layer of nitride and through the layer of oxide to access selected device regions formed in the substrate.

29 Claims, 9 Drawing Sheets

INTEGRATED CIRCUIT WITH A MOS CAPACITOR

TECHNICAL FIELD

The present invention relates generally to MOS devices incorporated in integrated circuits and in particular the present invention relates to an integrated circuit having a MOS capacitor.

BACKGROUND

Integrated circuits incorporate complex electrical components formed in semiconductor material into a single device. Generally, an integrated circuit comprises a substrate upon which a variety of circuit components are formed wherein each of the circuit components are electrically isolated from each other. Integrated circuits are made of semiconductor material. Semiconductor material is material that has a resistance that lies between that of a conductor and an insulator. Semiconductor material is used to make electrical devices that exploit its resistive properties. A common type of semiconductor structure is the metal-oxide semiconductor (MOS).

Semiconductor material is typically doped to be either a N type or a P type. N type semiconductor material is doped with a donor type impurity that generally conducts current via electrons. P type semiconductor material is doped with an acceptor-type impurity that conducts current mainly via hole migration. A N type or P type having a high impurity or high dopant concentration or density is denoted by a "+" sign. A N type or P type having a low impurity or low dopant concentration or density is denoted by a "−" sign.

A capacitor can be formed using a MOS structure. A capacitor is a device that holds an electrical charge. A capacitor comprises a dielectric positioned between a top plate and a bottom plate. Typically, a capacitor of an integrated circuit is formed using the semiconductor material of a substrate as the bottom plate. An integrated circuit may comprise a plurality of capacitors created from a single substrate to form a circuit. Generally, MOS capacitors consume a relatively significant amount of area in many analog circuits.

A typical MOS capacitor formed in an integrated circuit comprises a heavily doped semiconductor surface as a bottom plate, a silicon dioxide (oxide) as a dielectric layer and a metal interconnect or poly layer as a top plate. The capacitance of this type of capacitor is given by the equation $C=\epsilon A/T$, where C=capacitance, $\epsilon$=the dielectric constant of material that makes up the dielectric, A=the area of the capacitor plate and T=thickness of the dielectric. One method of reducing the capacitor area in an integrated circuit is by substituting silicon nitride (nitride) for the oxide as the dielectric. The dielectric constant of nitride is approximately 7/3.9 that of oxide. In addition, the two films, nitride and oxide, have about the same voltage blocking strength (rupture electric fields) so a layer of the same thickness can be used. Accordingly, the substitution of a layer nitride in place of a layer of oxide of the same thickness will reduce the capacitor area by about 44%.

Typically, the nitride is deposited over the entire substrate surface by low pressure chemical vapor deposition (LPCVD) or plasma enhance chemical vapor deposition (PECVD). The nitride is then patterned to form contact apertures or contact openings. This process usually, involves an extra pattering step when nitride overlays oxide that is not required when the oxide layer is used. Extra pattering steps add cost to the manufacture of integrated circuits. It is desired in the art to form an integrated circuit with reduced process steps.

For the reasons stated above and for other reasons stated below which will become apparent to those skilled in the art upon reading and understanding the present specification, there is a need in the art for forming an integrated circuit having a MOS capacitor with reduced process steps.

SUMMARY

The above-mentioned problems are addressed, as well as other problems, by the present invention and will be understood by reading and studying the following specification.

In one embodiment, a method of forming a contact opening through a dielectric layer overlaying an oxide layer in an integrated circuit is disclosed. The method comprises forming a layer of mask material overlaying the dielectric layer. Patterning the layer of mask material to expose a pre-selected portion of the nitride layer and forming anisotropic contact openings that extend through the layer of dielectric and the layer of oxide using a dry etch with a single mask.

In another embodiment, a method of forming an integrated circuit is disclosed. The method comprises forming an oxide layer on a surface of a substrate, the substrate having a plurality of isolation islands, wherein at least one isolated island is used in forming a semiconductor device. Patterning the oxide layer to expose predetermined areas of the surface of the substrate. Depositing a nitride layer overlaying the oxide layer and the exposed surface areas of the substrate and implanting ions through the nitride layer. The nitride layer is used as an implant screen for the implanted ions.

In another embodiment, a method of forming an integrated circuit. The method comprises. Forming an oxide layer on a surface of a substrate. The substrate has a plurality of isolation islands. At least one isolation island is used to form a semiconductor device of the integrated circuit. Patterning the oxide layer to expose predetermined areas of the surface of the substrate. Depositing a dielectric layer overlaying the oxide layer and the exposed surface areas of the substrate. The dielectric layer has a higher dielectric constant than a dielectric constant of the oxide layer. Implanting ions through the dielectric layer. Diffusing the ions to form device regions in selected isolation islands in the substrate and using the dielectric layer in at least one of the isolation islands as a capacitor dielectric in forming a capacitor.

In another embodiment, a method of forming an integrated circuit is disclosed. The method comprising forming a first oxide layer on a surface of a substrate. The substrate has a plurality of isolation islands. At least one isolation island is used in forming a semiconductor device of the integrated circuit. Patterning the first oxide layer to expose predetermined areas of the surface of the substrate. Implanting and diffusing ions through the second oxide layer into the substrate to form device regions. Forming a dielectric layer overlaying the oxide layer and the exposed areas of the surface of the substrate. The dielectric layer has a dielectric constant higher than a dielectric constant of the oxide layer. Using the dielectric layer in at least one of the isolation islands as a capacitor dielectric in forming a capacitor.

In another embodiment, a method of forming a capacitor and a transistor in an integrated circuit. The method comprising, forming a plurality of isolation islands in a substrate of a first conductivity type with low dopant density. The substrate contains a capacitor isolation island to form the capacitor in and a transistor isolation island to form the transistor in. Forming a base of a second conductivity type in the transistor isolation island adjacent a surface of the substrate. Forming a layer of oxide on a surface of the substrate. Patterning the layer of oxide to form pre-selected exposed surface areas of the substrate. Forming a layer of dielectric over the layer of oxide and the exposed surface areas of the substrate. Implanting dopants of the first conductivity type with high dopant density through the layer of dielectric into the substrate. Diffusing the dopants to form a bottom plate in the capacitor isolation island and an emitter and collector contact in the transistor isolation island. The emitter is formed in a portion of the base. The bottom plate, the emitter and the collector contact are formed adjacent the surface of the substrate. Using a dry etch to form contact opening through the dielectric layer to the bottom plate in the capacitor isolation island. Using a dry etch to form a contact opening through the dielectric layer and the oxide layer to the base in the transistor isolation island. Using a dry etch to form a contact opening through the dielectric layer to the collector contact and the emitter in the transistor isolation island. Forming a layer of metal overlaying the dielectric layer and the contact openings and etching the layer of metal to form a top plate and a bottom plate contact region in the capacitor isolation region and an emitter contact region, a base contact region and a collector contact region in the transistor isolation region.

In another embodiment, an integrated circuit is disclosed. The integrated circuit comprises, a substrate, a layer of oxide, a layer of dielectric and at least one capacitor. The substrate has a plurality of isolation islands. At least one isolation island has a semiconductor device formed therein. The layer of oxide is formed and patterned on a surface of the substrate. The layer of dielectric is formed overlaying the layer of oxide and exposed surface areas of the substrate. The layer of dielectric has a dielectric constant that is higher than the dielectric constant of the layer of oxide. Moreover, the dielectric layer is used as an implant screen in implanting dopants into respective isolation islands to form device regions for the at least one semiconductor device. The at least one capacitor is formed in one of the isolated islands in the substrate. Each capacitor uses the layer of dielectric as a capacitor dielectric. Each capacitor dielectric is positioned between a top plate and a bottom plate.

In another embodiment, an integrated circuit is disclosed. The integrated circuit comprises, a substrate, a layer of oxide, a layer of dielectric and at least one capacitor. The substrate has a plurality of isolation islands. At least one isolation island has a semiconductor device formed therein. The layer of oxide is formed and patterned on a surface of the substrate. The layer of dielectric is formed overlaying the layer of oxide and exposed surface areas of the substrate. The layer of dielectric has a dielectric constant that is higher than the dielectric constant of the layer of oxide. The layer of dielectric and the layer of oxide have anisotropic openings to expose device regions in the substrate. The openings are formed by a dry etch. The at least one capacitor is formed in one of the isolated island in the substrate. Each capacitor uses the layer of dielectric as a capacitor dielectric. Each capacitor dielectric is positioned between a top plate and a bottom plate.

In another embodiment, an integrated circuit is disclosed. The integrated circuit comprises a substrate, one or more semiconductor devices, a oxide layer, a nitride layer and at least one capacitor. The substrate has a surface and a plurality of isolation islands. Each semiconductor device is formed in an associated isolation island. Some of the semiconductor devices have device regions formed adjacent the surface of the substrate. The oxide layer is formed and patterned on the surface of the substrate. The nitride layer overlays the patterned oxide layer and any exposed surface area of the substrate. The oxide and nitride layers that overlay select device regions have a contact opening to the device region that is formed by a dry etch. The at least one capacitor is formed in one of the isolation islands. The at least one capacitor also has a capacitor dielectric that is formed from a portion of the nitride layer.

BRIEF DESCRIPTION OF THE DRAWINGS

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms, such as "on", "side" (as in "sidewall"), "higher", "lower", "over," "top" and "under" are defined with respect to the conventional plane or working surface being on the top surface of the wafer or substrate, regardless of the orientation of the wafer or substrate.

Figure 1A:
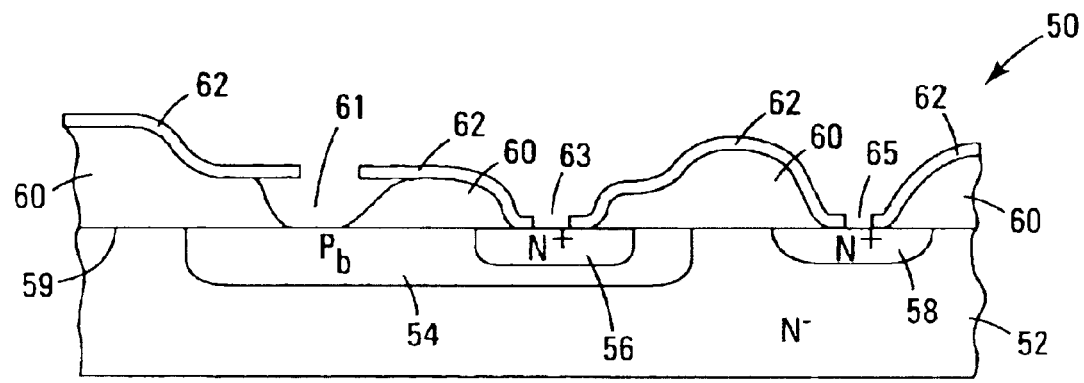
FIG. 1A is a cross-section view illustrating the formation of contact openings to device regions of the prior art.
Figure 1B:
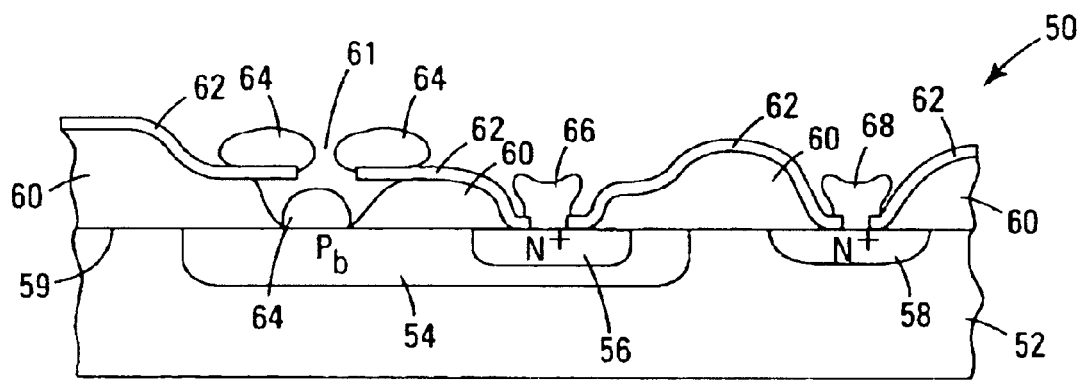
FIG. 1B is a cross-sectional view illustrating the formation of contact openings to device regions of the prior art.

Before the present invention is described, further background is provided to aid in the understanding of features of the present invention. Referring to FIGS. 1 (A–B), an illustration of the partial formation of an NPN transistor 50 of the prior art is shown. The NPN transistor 50 is formed in a substrate 52 of an integrated circuit. A base 54, an emitter 56 and a collector contact 58 are formed in the substrate 52. A layer of nitride 62 is deposited over a layer of oxide 60. Typically, in forming contact openings 61, 63 and 65 for the NPN transistor 50, a second layer of oxide (not shown) is formed over nitride layer 62. A contact pattern is then etched into the second layer of oxide where the contact openings 61, 63 and 65 are to be formed with a photo resist mask. A layer of photo resist is then applied to the second oxide layer and a contact pattern is formed by conventional means. The contact pattern is etched into the second oxide layer in the pattern defined by the patterned photo resist layer. The photo resist is then stripped. The nitride layer 62 is etched with a wet etch (hot phosphoric acid) using the patterned second oxide as a mask (the second layer of oxide is typically used as a mask because the photo resist is not an effective mask against the hot phosphoric nitride etchant). Then the first oxide layer 60 is etched with a wet etch (buffered HF) using the nitride as a mask. Any remaining second layer of oxide is removed during this step. The wet etch to form the contact openings 61, 63 and 65 through oxide layer 60 is isotropic. This results in a sidewall profile with a slope of about 45% with an undercut of the edge of the nitride layer 62 about equal to the thickness of oxide layer 60. This is illustrated in contact opening 61 of FIG. 1A. Thereafter, when contacts 64, 66, 68 are formed with a patterned metal layer, contact 64 in contact opening 61 may not be properly formed causing the device to fail. In particular, the metal layer that forms contact 64 may break at the edges of the dielectric layer 62 in contact opening 61 resulting in an open circuit. This is illustrated in FIG. 1B.

Figure 2A:
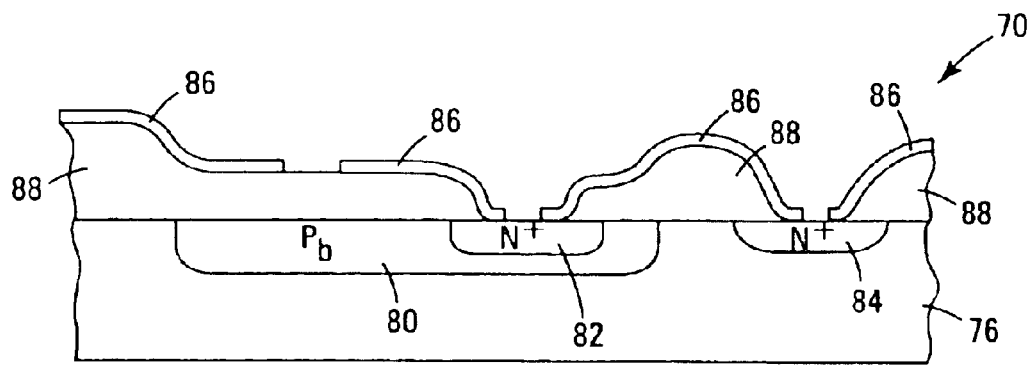
FIG. 2A is a cross-sectional view illustrating the formation of contact openings to device regions of the prior art.
Figure 2B:
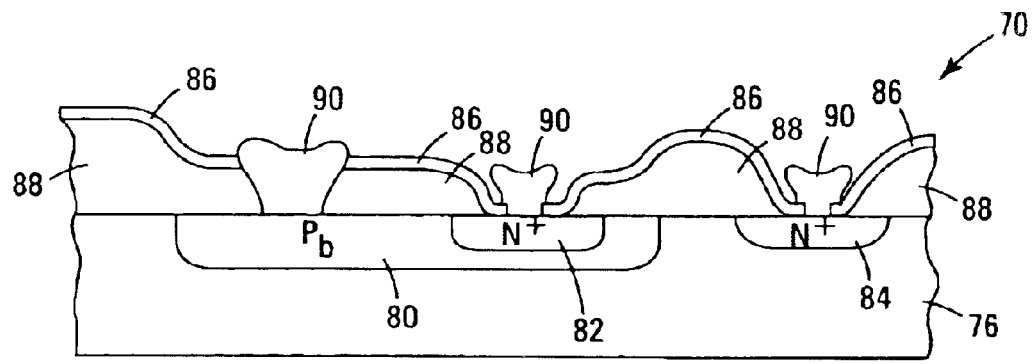
FIG. 2B is a cross-sectional view illustrating the formation of contact openings to device regions of the prior art.

A known method of avoiding the aforementioned problem with the undercutting is by using an additional mask step. This is illustrated in FIGS. 2(A–B). As illustrated in FIG. 2A, a first mask is used to pattern the dielectric layer 86. A second nested mask is used to form an opening through the layer of oxide 88 to the base 54, as illustrated in FIG. 2B. One feature of the present invention is the elimination of the second nesting mask step.

Figure 3:
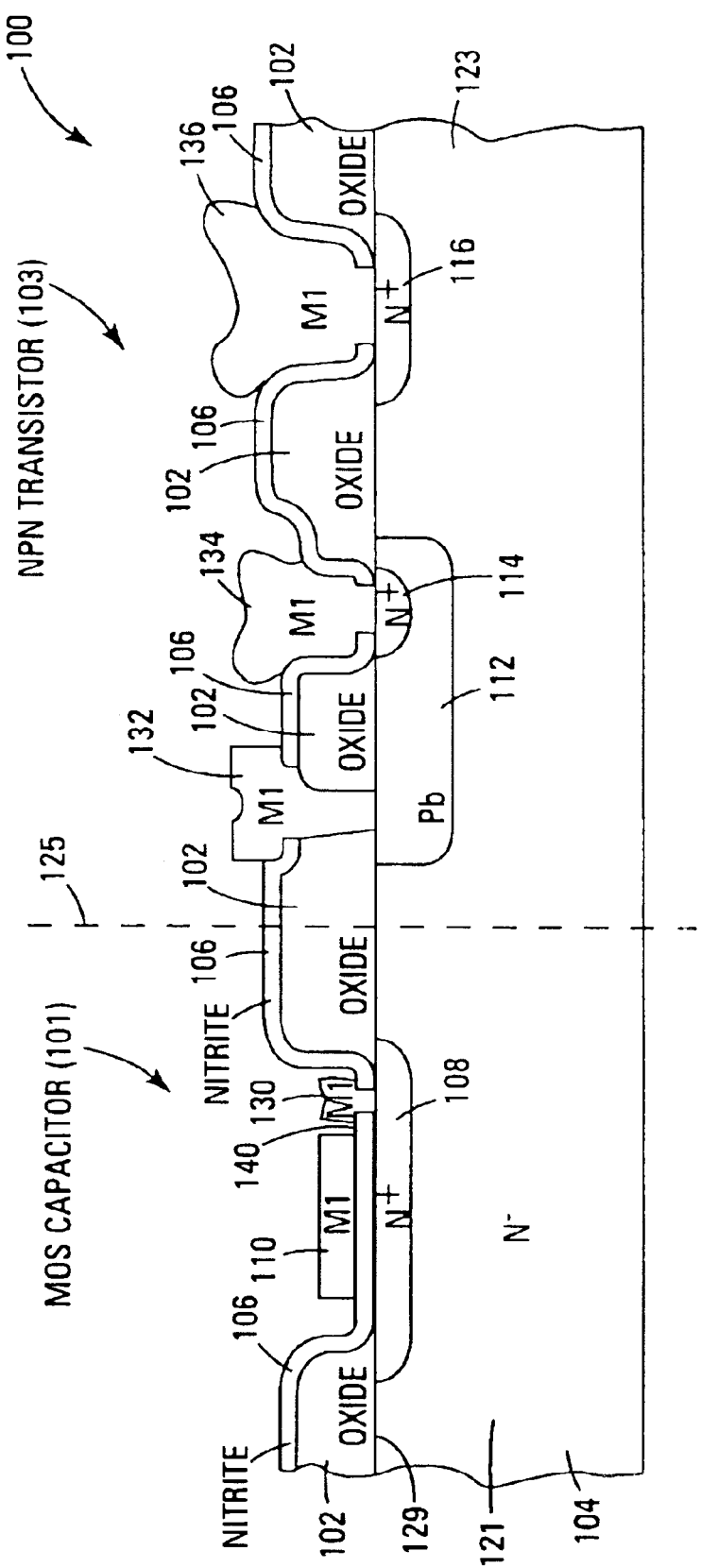
FIG. 3 is a cross-sectional view of a portion of an integrated circuit of one embodiment of the present invention.

Referring to FIG. 3, one embodiment of the present invention is illustrated. FIG. 3 illustrates a MOS capacitor 101 and a NPN transistor 103 formed in an integrated circuit 100. Dashed line 125 is drawn in FIG. 3 to illustrate where the MOS capacitor 101 ends and the NPN transistor 103 starts. Although, not illustrated in FIG. 3, it will be understood in the art that the MOS capacitor 101 would be isolated from the NPN transistor 103 by an isolation region. It will also be understood in the art that a common way to isolate semiconductor devices in an integrated circuit is to create isolated islands in the substrate upon which they have been formed. In the embodiment shown in the FIG. 3, MOS capacitor 101 is formed in isolated island 121 and the NPN transistor 103 is formed in isolated island 123. An illustration of the formation of isolated islands in a substrate of an integrated circuit is provided below in reference to FIGS. 7(A–D).

The MOS capacitor 101 and the NPN transistor 103 are formed in a substrate 104 of the integrated circuit 100, as illustrate in FIG. 3. The substrate is of an N conductivity type with low dopant density. Capacitor 101 comprises a bottom plate 108 which is a N+ device region formed in the substrate 104 adjacent a surface 129 of the substrate 104. The capacitor 101 also has top plate 110 that is separated from the bottom plate 108 by a capacitor dielectric 140. In one embodiment, the capacitor dielectric layer 140 is a layer of nitride 140. The top plate 110 is made of a metal. The capacitor 101 further has a bottom plate contact region 130 coupled to the bottom plate 108. In one embodiment, the top plate 110 and bottom plate contact region 130 is patterned from a metal layer.

The NPN transistor 103 comprises a base 112 of the P conductivity type formed in the substrate 104 adjacent the surface 129 of the substrate 104. An emitter 114 of the N conductivity type with high dopant density is formed in the base 112 adjacent the surface 129 of the substrate. A collector contact 116 of the N conductivity type with high dopant density is formed in the substrate 104 adjacent the surface 129 of the substrate 104 and a predetermined distance from base 112. A base contact region 132 is coupled to the base 112. An emitter contact region 134 is coupled to the emitter 114. Moreover, a collector contact region 136 is coupled to the collector contact 116. In one embodiment, the base contact region 132, the emitter contact region 134 and the collector contact region 136 are made from a metal layer.

In one embodiment of the present invention, a portion of a layer of nitride 106 that is deposited on the substrate 104 is used to form the capacitor dielectric 140. Moreover, in another embodiment of the present invention, the nitride 106 is used as an implant screen in forming device areas in the substrate. For example, bottom plate 108 of capacitor 101 and emitter 114 and collector contact 116 of transistor 103 are formed by implanting a high density of N type ions through the nitride 106 at selected areas.

The formation of one embodiment of the present invention is illustrated in FIGS. 4(A–F). Referring to FIG. 4A, P conductivity type dopants are implanted and diffused in a substrate of N conductivity type dopants with low dopant density to form the base 112 adjacent the surface 129 of the substrate 104. A layer of oxide 102 is formed on the surface 129 of the substrate 104. The layer of oxide 102 can be thermally grown, deposited or formed in any other manner known in the art. The layer of oxide 102 is then patterned to expose pre-selected areas of the substrate 104 surface 129, as illustrated in FIG. 4B. In particular, the layer of oxide 102 is selectively etched to form a pattern to define N+ device regions. Referring to FIG. 4C, a layer of nitride 106 is then formed overlaying the remaining portions of oxide 102 and the exposed areas of substrate 104 surface 129. In one embodiment, the layer of nitride 106 is deposited by low pressure chemical vapor deposition (LPCVD). However, it will be recognized in the art that there are other means for forming a high quality nitride layer, such as plasma enhanced chemical vapor deposition (PECVD), and that the present invention is not limited to LPCVD.

Figure 4A:
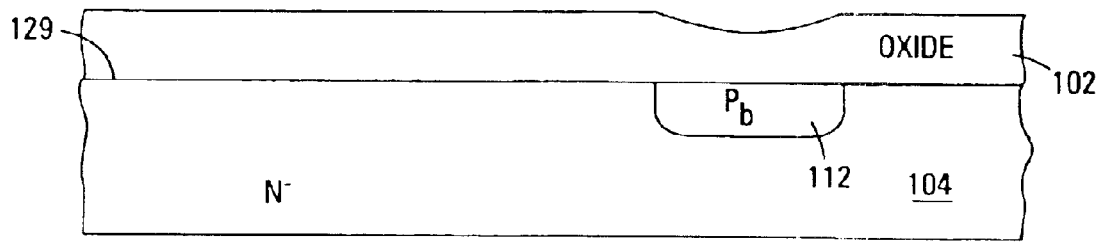
FIGS. 4(A–F) are cross-sectional views of the formation of one embodiment of the present invention.
Figure 4B:
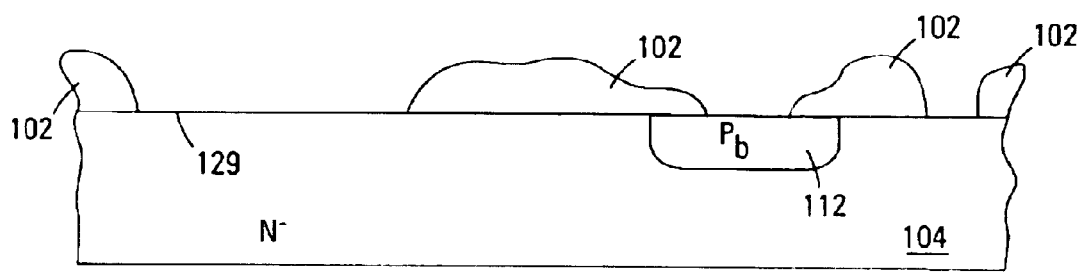
Figure 4C:
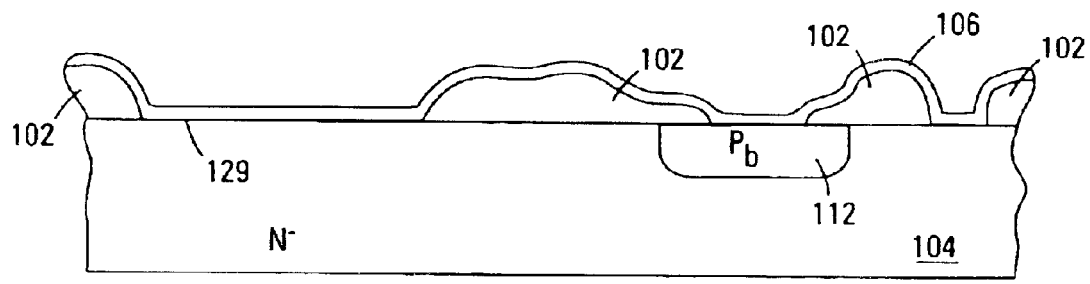
Figure 4D:
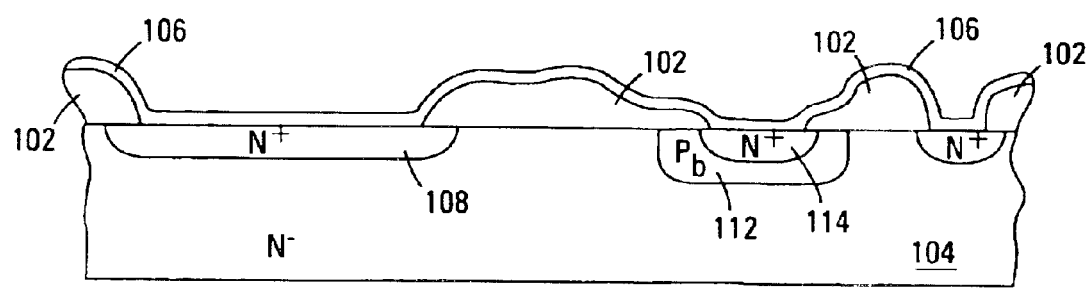

Referring to FIG. 4D the N+ regions 108, 114 and 116 are then formed by implanting high density N conductivity type ions through the layer of nitride 106 and then diffusing the ions to a final depth. In this embodiment, the layer of nitride 106 acts as an implant screen. Moreover, the remaining patterned oxide regions 102, under the nitride layer 106, act a barrier to the ions to selectively position the N+ regions 108, 114 and 116 in the substrate 104. As illustrated in FIG. 4D, the N+ regions 108, 114 and 116 are the bottom plate 108 of the capacitor 101 and the emitter 114 and collector contact 116 of the transistor 103 respectfully.

Figure 4E:
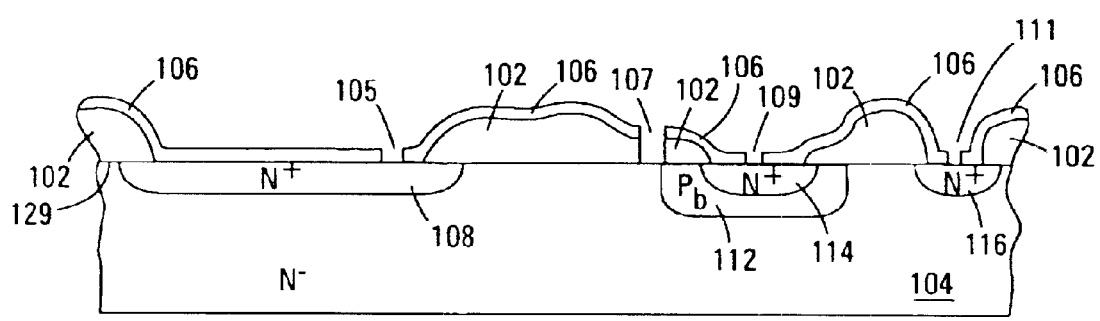

Apertures 105, 107, 109 and 111 (contact openings) are then formed thought the layer of nitride 106 and, where present, through the oxide 102. This is illustrated in FIG. 4E. The present invention, uses a dry etch to form apertures 105, 107, 109 and 111. In particular, in contact openings that have to go through the nitride layer 106 and the oxide layer 102 a dry etch is used. A dry etch refers to an etch process that uses gases as a primary etch medium. In one embodiment, a reactive ion etch (RIE) dry etch is used. Other dry etch methods can be used, including plasma and ion beam milling.

An advantage of using a dry etch over a traditional wet etch is that the dry etch can produce an anisotropic contact opening. An anisotropic contact opening has an aperture with a sidewall slope that is approximately vertical. Traditional wet etching processes, on the other hand, produce a sidewall that typically has an undercutting. Typically, with a layer of nitride overlaying a layer of oxide, a wet etch would produce an aperture having a layer of nitride that is undercut by a layer of oxide. That is, if the aperture was cylindrical in form, the diameter of the aperture of the layer of oxide would be greater than the diameter of the aperture in the layer of nitride thereby creating a sidewall with an undercutting. An aperture having an undercutting provides a very poor step coverage for the metal contacts that are subsequently deposited in the apertures. Therefore, an anisotropic contact opening is desired. One method previously used to avoid the undercutting was to use two separate masks. The first mask was used to cut an aperture through the first layer of nitride and the second mask with a smaller diameter was used to cut an aperture through the layer of oxide. The use of the dry etch of the present invention, however, only requires one mask while still providing an anisotropic contact opening.

Figure 4F:
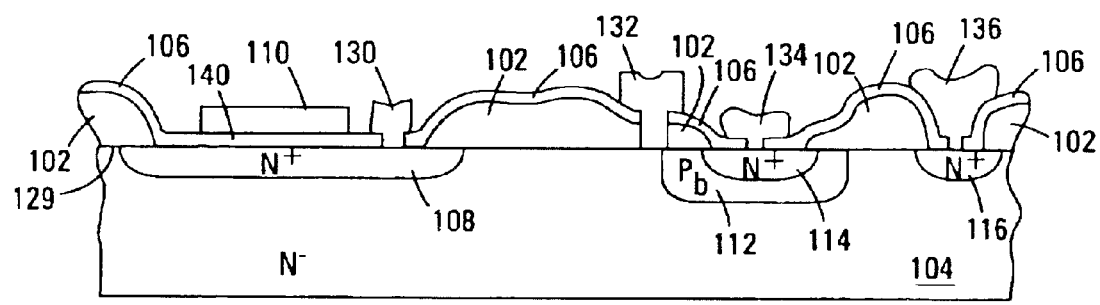

Referring to FIG. 4F, a metal layer is formed overlaying the nitride layer 106 and the exposed contact areas of the surface 129 of the substrate 104 formed by the dry etching. After the metal layer is deposited, it is patterned into the top plate 110, the bottom plate contact region 130, the base contact region 132, the emitter contact region 134 and the collector contact region 136.

Figure 5A:
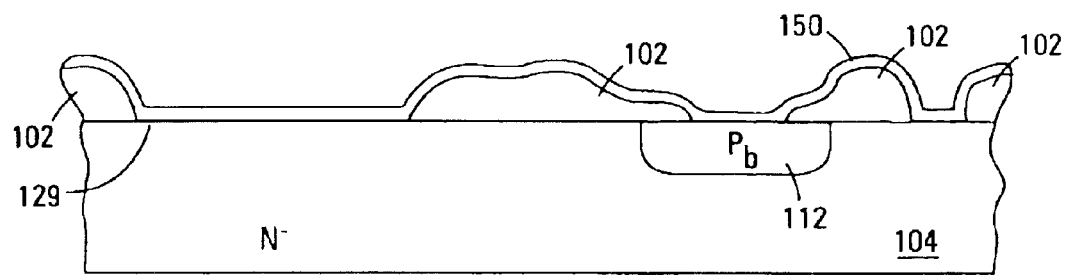
FIGS. 5(A–D) are cross-sectional views of the formation of another embodiment of the present invention.
Figure 5B:
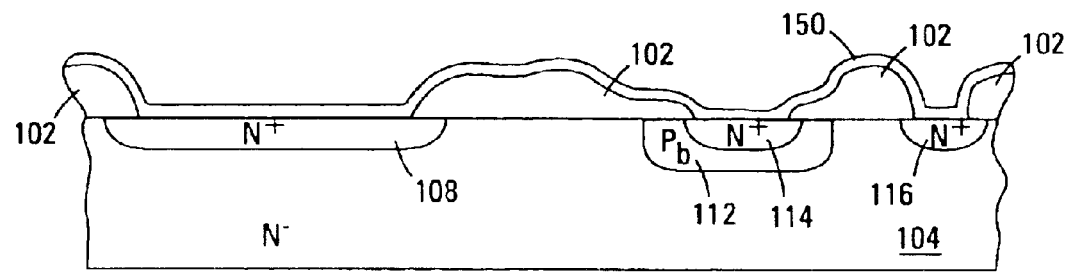
Figure 5C:
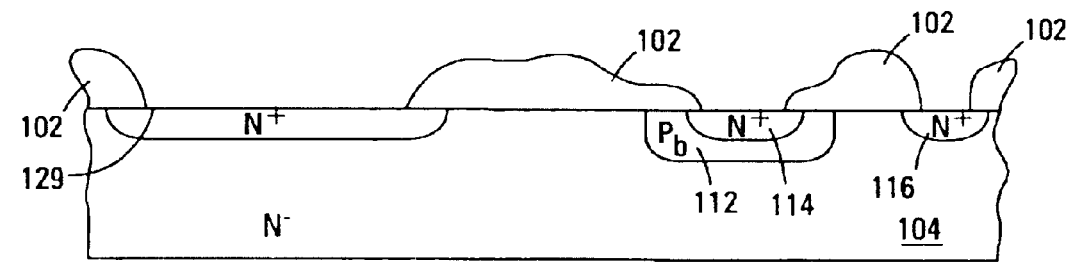
Figure 5D:
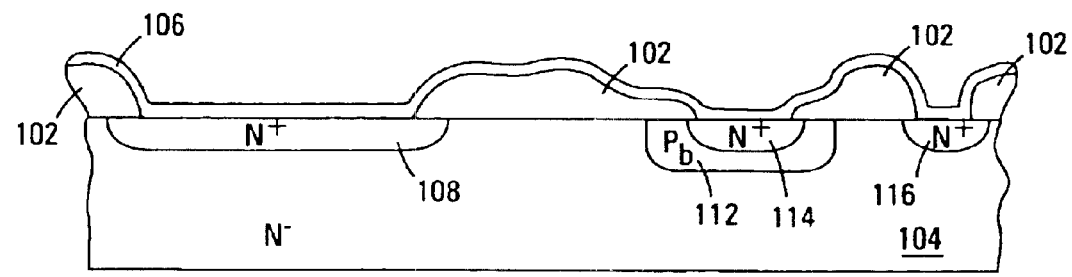

In another embodiment, the N+ device regions 108, 114 and 116 are formed before the nitride layer 106 is deposited. The beginning steps for this embodiment are the same as illustrated in FIGS. 4(A–B). Referring to FIG. 5A, a second layer of oxide 150 is then formed overlaying the exposed surface 129 areas of the substrate 104 and the first areas of oxide 102 that had been previously formed and patterned. The N+ ions are then implanted through the second layer of oxide 102 to form N+ device regions 108, 114, and 116, as illustrated in FIG. 5B. A non-selective buffered hydrofluoric acid (HF) wet etch is then used to remove the second layer of oxide 150 to expose the surface 129 of the substrate 104 adjacent N+ device regions 108, 114 and 116. This is illustrated in FIG. 5C. Referring to FIG. 5D the layer of nitride 106 is then formed overlaying the exposed surface areas 129 of the substrate 104 and the remaining oxide 102 regions. The remaining steps in forming the integrated circuit 100 are the same as illustrated in FIGS. 4(E–F)

In one embodiment where the N+ regions 108, 114 and 116 are formed before the nitride layer 106 is formed, an open tube deposition using phosphorus oxychloride ($POCl_3$) as a dopant source in the gas stream is used to form the N+ regions 108, 114 and 116. This method is known for forming deep heavily doped junctions. An advantage of this embodiment, is that it forms a relatively heavily rich phosphorus glaze overlaying the oxide layer 102. This heavily rich phosphorus glaze is the actual dopant source for the subsequent diffusions of N+ dopants into the substrate 104 to form the N+ region 108, 114 and 116. It is generally desired to retain the heavily rich phosphorus glaze on the surfaces because it is a material that traps mobile ions that can degrade device performance if they diffuse down to the surface 129 of the substrate 104. For example, in pure oxide sodium and several of the other mobile ions tend to diffuse relatively rapidly to the surface 129 of the substrate 104 and degrade device performance. However, these mobile ions have a high solubility in the phosphorus doped oxide. Therefore the mobile ions tend to be trapped in the phosphorus doped oxide. It has been discovered, that with the use of $POCl_3$ to form the N+ regions 108, 114 and 116, a controlled etch can be used to remove the oxide from the N+ region 108, 114 and 116 without removing all of the phosphorus doped oxide from the remaining oxide layer regions 102 without using a mask. That is, in this embodiment, a mask step is not needed in removing the second layer of oxide 150 formed during the N+ deposition using while preserving the mobile ion protection. It will be understood in the art that it may be possible to achieve the same result with an open tube deposition having phosphorus sources other than $POCl_3$ and that the present invention is not limited to using only $POCl_3$.

Although, the present invention has, up to this point, been described as using the layer of nitride 106, it will be understood that other types of dielectric layers that have a dielectric constant higher than that of the oxide layer 102 could be used and that the present invention is not limited to using a layer of nitride 106. However, when using other types of dielectric, the use of $POCl_3$ to form the N+ regions device regions 108, 114 and 116 is particularity important, since other types of dielectric are generally not as good a mobile ion barrier.

Figure 6A:
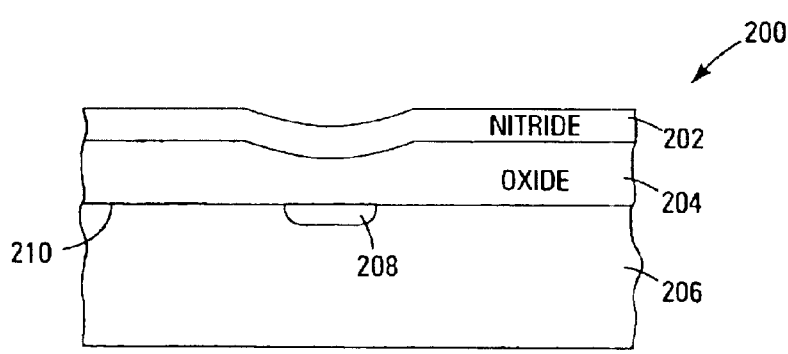
FIGS. 6(A–D) are cross-sectional views of the formation of an opening of one embodiment of the present invention.
Figure 6B:
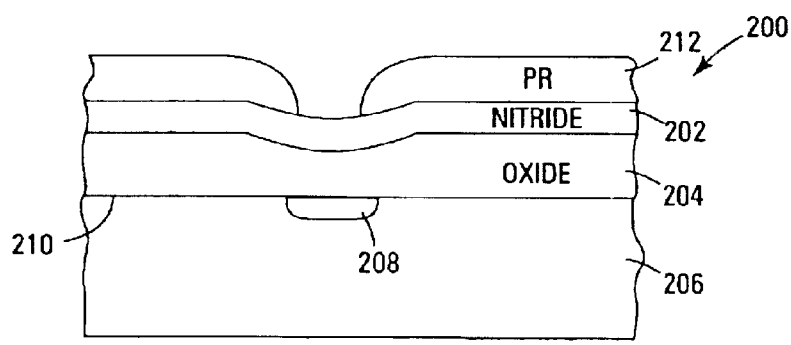
Figure 6C:
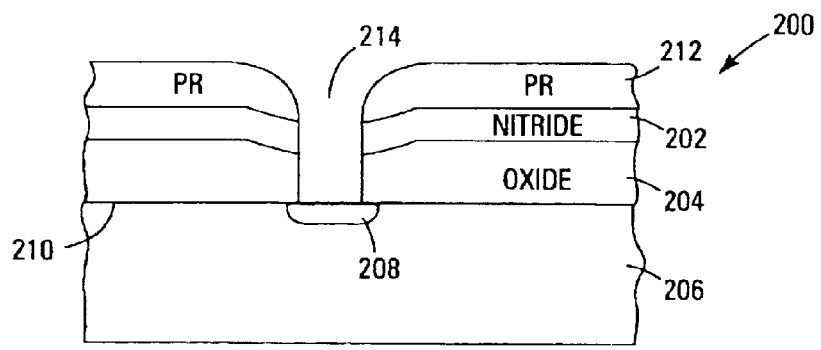
Figure 6D:
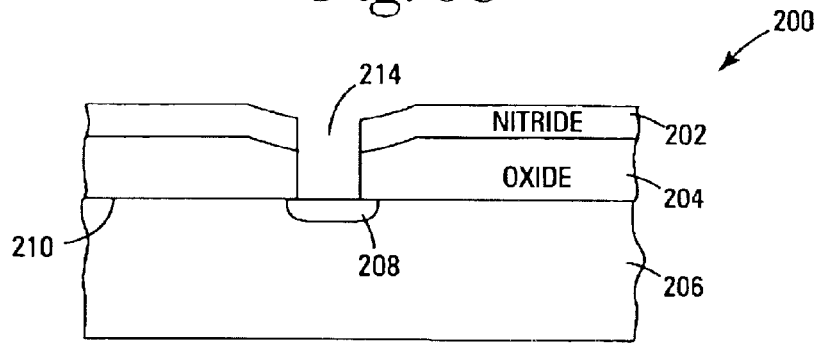
Figure 7A:
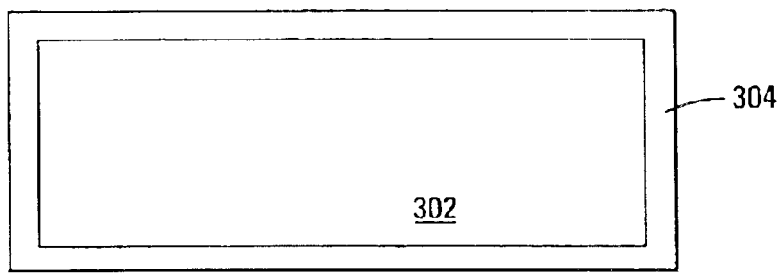
FIGS. 7(A–D) are cross-sectional views of the formation of isolation islands of the prior art.
Figure 7B:
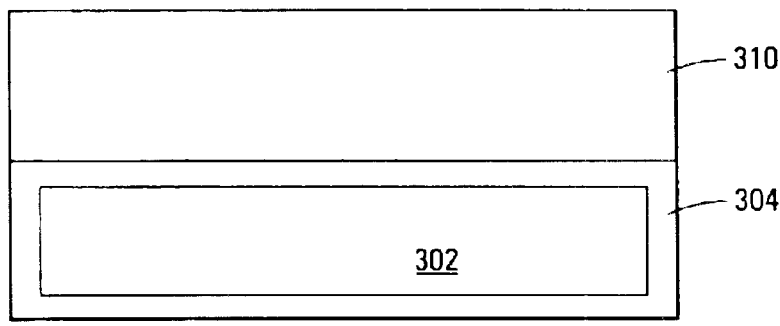
Figure 7C:
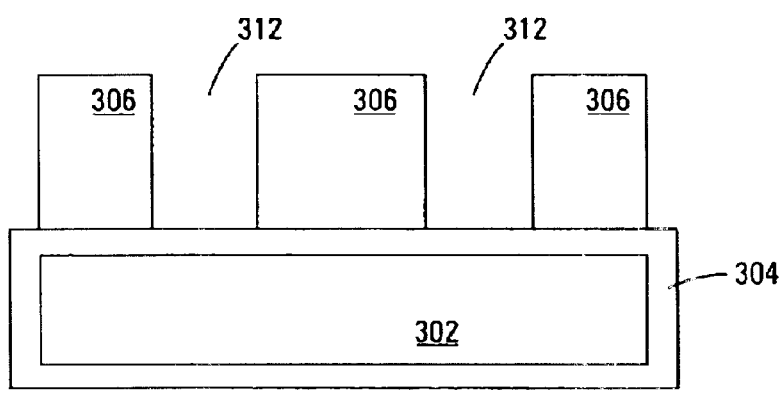
Figure 7D:
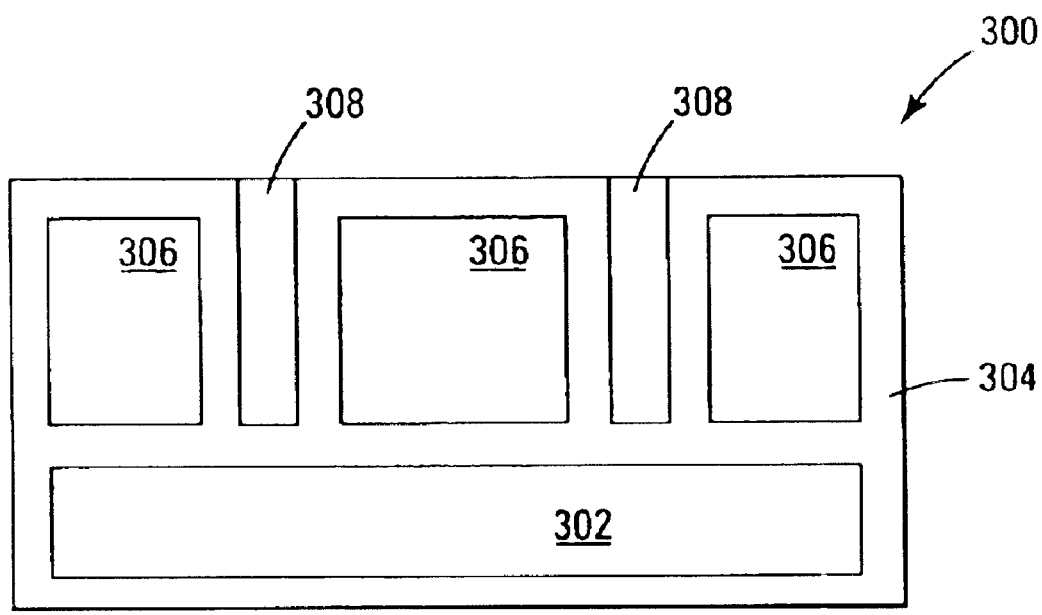

The integrated circuit 100 of the present invention has also been described as containing a capacitor, however, the teaching of the present invention relating to the creation of openings through a layer of nitride and a layer of oxide can be applied to integrated circuits not containing capacitors. Typically, these types of integrated circuits use the nitride layer as a mobile ion barrier. The creation of the contact openings through a nitride layer and oxide layer to a device region of one embodiment of the present invention is illustrated in FIGS. 6(A–D). Referring to FIG. 6A, a portion of an integrated circuit 200 is illustrated. This portion has a layer of nitride 202 overlaying a layer of oxide 204, which in turn is overlaying a substrate 206. FIG. 6A also illustrates a device region 208 formed in the substrate 206 adjacent a surface 210 of the substrate 206. A photo resist (PR) mask layer 212 is formed overlaying the layer of nitride 202 and patterned, as illustrated in FIG. 6B. A dry etch as described above, is then applied to form the opening 214 or aperture 214 through the layer of nitride 202 and layer of oxide 204. This is illustrated in FIG. 6C. Referring to FIG. 6D, the PR mask 212 is then removed. As stated above, the use of the dry etch eliminates a separate mask step used to form the opening through the layer of oxide 204.

Moreover, although the embodiment of the integrated circuit 100 of FIG. 3 as including a NPN transistor 103, it will be understood in the art that other embodiments of the present invention may include different types of semiconductor devices that require contact openings through a nitride layer and an oxide layer to a device region as described above. Accordingly, the present invention is not limited to integrated circuits having NPN transistors.

One method of forming isolation islands for semiconductor devices in an integrated circuit is illustrated in FIGS. 7(A–D). Referring to FIG. 7A, a handle wafer 302 is first oxidized to form an oxidation oxide layer 304 around the handle wafer 302. A device wafer 310 (or substrate 310) is placed in contact with the handle wafer 302 as illustrated in FIG. 7B. The device wafer 310 and the handle wafer 302 are then heated causing the device wafer 310 to be bonded to the handle wafer 302. The device wafer 310 is then thinned to obtain a desired thickness. Referring to FIG. 7C, the device wafer 310 is then patterned to form isolation trenches 312 that extend to the isolation oxide 304 on the handle wafer 302. A layer of isolation oxide 304 is then formed on the sidewalls of the trenches 312. The trenches 312 are then filled with the poly silicon 308 as illustrated in FIG. 7D. The finished islands 306 are isolated on all sides by the oxide layer 304 to form isolation islands 306 in the integrated circuit 300.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of forming an integrated circuit, the method comprising:
   forming an oxide layer on and in contact with a surface of a substrate, the substrate having a plurality of isolation islands, wherein at least one isolation island is used in forming a semiconductor device;
   patterning the oxide layer to expose predetermined areas of the surface of the substrate;
   depositing a nitride layer overlaying the oxide layer and the exposed surface areas of the substrate, wherein the nitride layer is in contact with the oxide layer and all of the exposed surface areas created by the patterning of the oxide layer;
   implanting ions through the nitride layer, wherein the nitride layer is an implant screen for the implanted ions; and
   using the nitride layer in at least one of the isolation islands as a capacitor dielectric in forming a capacitor.

2. The method of claim 1, further comprising:
   diffusing the ions to form device regions in selected isolation islands in the substrate.

3. A method of forming an integrated circuit, the method comprising:
   forming an oxide layer on and in contact with a surface of a substrate, the substrate having a plurality of isolation islands, wherein at least one isolation island is used in forming a semiconductor device;
   patterning the oxide layer to expose predetermined areas of the surface of the substrate;
   depositing a nitride layer overlaying the oxide layer and the exposed surface areas of the substrate, wherein the nitride layer is in contact with the oxide layer and all of the exposed surface areas created by the patterning of the oxide layer; implanting ions through the nitride layer, wherein the nitride layer is an implant screen for the implanted ions; and
   performing a dry etch to form anisotropic contact openings that extend through the layer of nitride and through the layer of oxide to access selected device regions formed in the substrate.

4. The method of claim 3, further comprising:
   diffusing the ions to form device regions in selected isolation islands in the substrate.

5. A method of forming an integrated circuit, the method comprising:
   forming an oxide layer on and in contact with a surface of a substrate, the substrate having a plurality of isolation islands, wherein at least one isolation island is used in forming a semiconductor device;
   patterning the oxide layer to expose predetermined areas of the surface of the substrate;
   depositing a nitride layer overlaying the oxide layer and the exposed surface areas of the substrate, wherein the nitride layer is in contact with the oxide layer and all of the exposed surface areas created by the patterning of the oxide layer;
   implanting ions through the nitride layer, wherein the nitride layer is an implant screen for the implanted ions; and
   wherein the dry etch used is a reactive ion dry etch.

6. The method of claim 5, further comprising:
   diffusing the ions to form device regions in selected isolation islands in the substrate.

7. A method of forming an integrated circuit, the method comprising:
   forming an oxide layer on and in contact with a surface of a substrate, the substrate having a plurality of isolation islands, wherein at least one isolation island is used in forming a semiconductor device of the integrated circuit;
   patterning the oxide layer to expose predetermined areas of the surface of the substrate;
   depositing a dielectric layer overlaying the oxide layer and the exposed surface areas of the substrate, wherein the dielectric layer has a higher dielectric constant than a dielectric constant of the oxide layer, further wherein the dielectric layer is in contact with the oxide layer and all of the exposed surface areas created by the patterning of the oxide layer;
   implanting ions through the dielectric layer;
   diffusing the ions to form device regions in selected isolation islands in the substrate; and
   using the dielectric layer in at least one of the isolation islands as a capacitor dielectric in forming a capacitor.

8. The method of claim 7, wherein the capacitor dielectric layer is a layer of silicon nitride.

9. The method of claim 7, further comprising:
   forming contact openings to the device regions.

10. The method of claim 9, wherein forming the contact openings further comprises:
    using a dry etch to selectively form contact openings through the dielectric layer and the oxide layer to expose selective areas of device regions formed in the substrate under the dielectric layer and the oxide layer.

11. The method of claim 10, wherein the dry etch forms generally vertical sidewalls in the contact opening with respect to the surface of the substrate.

12. The method of claim 9, further comprising:
depositing a layer of metal overlaying the layer of nitride and the exposed device regions through the contact openings; and
patterning the layer of metal contacts to form metal contact regions for each contact opening.

13. The method of claim 7, wherein the implanting and the diffusing of the ions creates a bottom plate of the MOS capacitor in an associated isolation island.

14. The method of claim 13, wherein forming the MOS capacitor further comprises:
depositing a layer of metal overlaying the dielectric layer and an associated contact opening; and
patterning the metal layer to form a top plate and a bottom plate contact region, wherein the bottom plate contact region is in contact with the bottom plate through the contact opening.

15. A method of forming an integrated circuit, the method comprising:
forming a first oxide layer on and in contact with a surface of a substrate, the substrate having a plurality of isolation islands, wherein at least one isolation island is used in forming a semiconductor device of the integrated circuit;
patterning the first oxide layer to expose predetermined areas of the surface of the substrate;
implanting and diffusing ions into the substrate to form device regions;
forming a dielectric layer overlaying the oxide layer and the exposed areas of the surface of the substrate, wherein the dielectric layer has a dielectric constant higher than a dielectric constant of the oxide layer, further wherein the dielectric layer is in contact with the oxide layer and all of the exposed surface areas created by the patterning of the oxide layer; and
using the dielectric layer in at least one of the isolation islands as a capacitor dielectric in forming a capacitor.

16. The method of claim 15, wherein the dielectric layer is a nitride layer formed by low pressure chemical vapor deposition.

17. The method of claim 15, further comprising:
using open tube deposition as a dopant source to form the device regions.

18. The method of claim 17, wherein the dopant source is phosphorus oxychloride.

19. The method of claim 17, wherein a non-selective etch is used to expose the surface of the substrate adjacent device regions before the dielectric layer is formed.

20. The method of claim 19, wherein the non-selective etch uses a wet etchant containing hydrogen fluoride.

21. The method of claim 15, further comprising:
forming contact openings to the device regions.

22. The method of claim 21, wherein forming the contact openings further comprises:
using a dry etch to selectively form contact openings through the dielectric layer and the oxide layer to expose selective areas of device regions formed in the substrate under the capacitor dielectric layer and the oxide layer.

23. The method of claim 21, wherein one of device regions formed in the isolation island containing the capacitor is a bottom plate and one of the contact openings is formed through the dielectric layer to expose a portion of the bottom plate.

24. The method of claim 23, wherein the forming of the capacitor further comprising:
depositing a layer of metal overlaying the dielectric layer and the contact opening to the bottom plate; and
patterning the metal layer to form a top plate and a bottom plate contact region, wherein a portion of the dielectric layer is positioned between bottom plate and the top plate and the bottom contact region is in contact with the bottom plate through the contact opening to the bottom plate.

25. A method of forming a capacitor and a transistor in an integrated circuit, the method comprising:
forming a plurality of isolation islands in a substrate of a first conductivity type with low dopant density, wherein the substrate contains a capacitor isolation island to form the capacitor in and a transistor isolation island to form the transistor in;
forming a base of a second conductivity type in the transistor isolation island adjacent a surface of the substrate;
forming a layer of oxide on a surface of the substrate;
patterning the layer of oxide to form pre-selected exposed surface areas of the substrate;
forming a layer of dielectric over the layer of oxide and the exposed surface areas of the substrate;
implanting dopants of the first conductivity type with high dopant density through the layer of dielectric into the substrate;
diffusing the dopants to form a bottom plate in the capacitor isolation island and an emitter and collector contact in the transistor isolation island, wherein the emitter is formed in a portion of the base, further wherein the bottom plate, the emitter and the collector contact are formed adjacent the surface of the substrate;
using a dry etch to form contact opening through the dielectric layer to the bottom plate in the capacitor isolation island;
using a dry etch to form a contact opening through the dielectric layer and the oxide layer to the emitter in the transistor isolation island;
using a dry etch to form a contact opening through the dielectric layer to the collector contact in the transistor isolation island;
forming a layer of metal overlaying the dielectric layer and the contact openings; and
etching the layer of metal to form a top plate and a bottom plate contact region in the capacitor isolation region and an emitter contact region and a collector contact region in the transistor isolation region.

26. The method of claim 25, wherein the dielectric layer is used as an implant screen in implanting the dopants into the respective isolation islands.

27. The method of claim 25, wherein a portion of the patterned dielectric layer is used as the capacitor dielectric in forming the capacitor.

28. The method of claim 25, wherein the dielectric layer is a nitride layer.

29. The method of claim 28, wherein the nitride layer is formed by low pressure chemical vapor deposition.

* * * * *